US012769048B2

(12) United States Patent
Li et al.

(10) Patent No.: US 12,769,048 B2
(45) Date of Patent: Oct. 20, 2026

(54) OPTICAL DEVICES HAVING BARRIER LAYERS TO FACILITATE REDUCED HARDMASK DIFFUSION AND/OR HARDMASK RESIDUE, AND RELATED METHODS

(71) Applicant: Applied Materials, Inc., Santa Clara, CA (US)

(72) Inventors: Rui Li, San Diego, CA (US); Takashi Kuratomi, San Jose, CA (US); Alexia Adilene Portillo Rivera, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 152 days.

(21) Appl. No.: 18/132,812

(22) Filed: Apr. 10, 2023

(65) Prior Publication Data

US 2023/0333309 A1 Oct. 19, 2023

Related U.S. Application Data

(60) Provisional application No. 63/331,377, filed on Apr. 15, 2022.

(51) Int. Cl.

| | |
|---|---|
| ***F21V 8/00*** | (2006.01) |
| ***C23C 14/08*** | (2006.01) |
| ***C23C 14/10*** | (2006.01) |
| ***C23C 14/22*** | (2006.01) |
| ***C23C 14/34*** | (2006.01) |
| ***G02B 5/18*** | (2006.01) |

(52) U.S. Cl.

CPC .......... *G02B 6/0065* (2013.01); *C23C 14/083* (2013.01); *C23C 14/10* (2013.01); *C23C 14/228* (2013.01); *C23C 14/34* (2013.01); *G02B 6/0016* (2013.01); *G02B 5/1857* (2013.01)

(58) Field of Classification Search

CPC ..... C23C 14/083; C23C 14/10; C23C 14/228; C23C 14/34; G02B 5/1857; G02B 6/0016; G02B 6/0065

See application file for complete search history.

(56) References Cited

U.S. PATENT DOCUMENTS

| | | | | |
|---|---|---|---|---|
| 11,139,637 | B2 | 10/2021 | McLaurin et al. | |
| 2004/0258947 | A1* | 12/2004 | Moelle | C23C 14/34 428/632 |

(Continued)

FOREIGN PATENT DOCUMENTS

| | | | |
|---|---|---|---|
| JP | 2003075670 | A | 3/2003 |
| KR | 102171571 | B1 | 10/2020 |

OTHER PUBLICATIONS

International Search Report and Written Opinion dated Jul. 31, 2023 for Application No. PCT/US2023/018055.

*Primary Examiner* — Sathavaram I Reddy
(74) *Attorney, Agent, or Firm* — Patterson + Sheridan, LLP

(57) ABSTRACT

Embodiments of the present disclosure generally relate to optical devices having barrier layers for reduced hardmask diffusion and/or hardmask residue, and related methods of forming the optical devices. In one or more embodiments, a plurality of optical device structures each include a barrier layer disposed between a device function layer and a hardmask layer prior to removal of the hardmask layer.

20 Claims, 8 Drawing Sheets

(56) References Cited

U.S. PATENT DOCUMENTS

| | | | | |
|---|---|---|---|---|
| 2015/0131140 | A1* | 5/2015 | Kailasam | H01B 5/14<br>359/266 |
| 2018/0136389 | A1 | 5/2018 | Wheeler et al. | |
| 2020/0294811 | A1 | 9/2020 | Matsubara et al. | |
| 2020/0301062 | A1 | 9/2020 | Young et al. | |
| 2020/0319386 | A1 | 10/2020 | Chen et al. | |
| 2020/0408970 | A1* | 12/2020 | Calafiore | G02B 6/0016 |
| 2022/0026603 | A1 | 1/2022 | Ceballos et al. | |

* cited by examiner

OPTICAL DEVICES HAVING BARRIER LAYERS TO FACILITATE REDUCED HARDMASK DIFFUSION AND/OR HARDMASK RESIDUE, AND RELATED METHODS

CROSS-REFERENCE TO RELATED APPLICATION

This application claims priority to U.S. provisional patent application Ser. No. 63/331,377, filed Apr. 15, 2022, which is herein incorporated by reference in its entirety.

BACKGROUND

Field

Embodiments of the present disclosure generally relate to optical devices having barrier layers for reduced hardmask diffusion and/or hardmask residue, and related methods of forming the optical devices.

Description of the Related Art

Hardmask materials can be used in the formation of optical devices. As an example, hardmask materials can be used in relation to etching operations. However, hardmask materials can diffuse through structures of the optical devices and/or residual hardmask can remain after removal of the hardmask, each of which can hinder device performance. For example, diffused hardmask material can interfere with light transmission and reduce the amount of light transmitting through structures of the optical device, thereby causing optical loss. Optical loss can hinder device performance, such as in augmented reality (AR) and/or virtual reality (VR) applications.

Additionally, it can be difficult to address such optical loss without reducing the amount of film (e.g., film loss) in the structures of an optical device. Film loss can also hinder device performance.

Therefore, there is a need for improved optical devices and related methods that facilitate reduced hardmask diffusion and/or hardmask residue while mitigating film loss.

SUMMARY

Embodiments of the present disclosure generally relate to optical devices having barrier layers for reduced hardmask diffusion and/or hardmask residue, and related methods of forming the optical devices. In one or more embodiments, a plurality of optical device structures each include a barrier layer disposed between a device function layer and a hardmask layer prior to removal of the hardmask layer.

In one or more embodiments, a device includes a transparent substrate, and one or more optical device structures disposed on a surface of the substrate. Each of the one or more optical device structures includes a device function layer formed of a metal oxide, the device function layer having a first refractive index, and a barrier layer disposed above the device function layer, the barrier layer having a second refractive index that is less than the first refractive index. An atomic percentage concentration of a hardmask material is less than 0.7% throughout each of the one or more optical device structures. The atomic percentage concentration includes a surface atomic percentage concentration (SAP) on an outer surface of each of the one or more optical device structures. The SAP is less than 0.7%. The atomic percentage concentration includes a volumetric atomic percentage concentration (VAP) along a height of each of the one or more optical device structures. The VAP is less than 0.7%.

In one or more embodiments, a method of forming a device having a plurality of optical device structures includes positioning a transparent substrate, and forming one or more device function layers on a surface of the transparent substrate. Each of the one or more device function layers is formed of a metal oxide and has a first refractive index. The method includes forming one or more barrier layers above the one or more device function layers. Each of the one or more barrier layers has a second refractive index that is less than the first refractive index. The method includes forming a plurality of hardmask layers above the one or more barrier layers. Each of the plurality of hardmask layers is formed of a hardmask material. The method includes conducting a first etching operation that selectively etches the device relative to the plurality of hardmask layers, and conducting a second etching operation that selectively etches the plurality of hardmask layers to remove the plurality of hardmask layers.

In one or more embodiments, a device includes a transparent substrate and one or more optical device structures disposed on a surface of the substrate. Each of the one or more optical device structures includes a device function layer formed of a metal oxide, the device function layer having a first refractive index, and a barrier layer disposed above the device function layer, the barrier layer having a second refractive index that is less than the first refractive index. A surface atomic percentage concentration (SAP) on an outer surface of each of the one or more optical device structures is less than 0.7%. A volumetric atomic percentage concentration (VAP) along a height of each of the one or more optical device structures is less than 0.3%. The VAP is 0.1% or less beginning at a depth and throughout a remaining height of each of the one or more optical device structures. The depth is within a range of 0.1 nm to 108 nm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to optical devices having barrier layers for reduced hardmask diffusion and/or hardmask residue, and related methods of forming the optical devices. In one or more embodiments, a plurality of optical device structures each include a barrier layer disposed between a device function layer and a hardmask layer prior to removal of the hardmask layer.

Unless specified otherwise, the chemicals referred to herein can have any number of atoms for the elements included. For example, niobium oxide (NbO) can have any number of niobium atoms and any number of oxygen atoms (e.g., stoichiometric or non-stoichiometric).

Figure 1A:
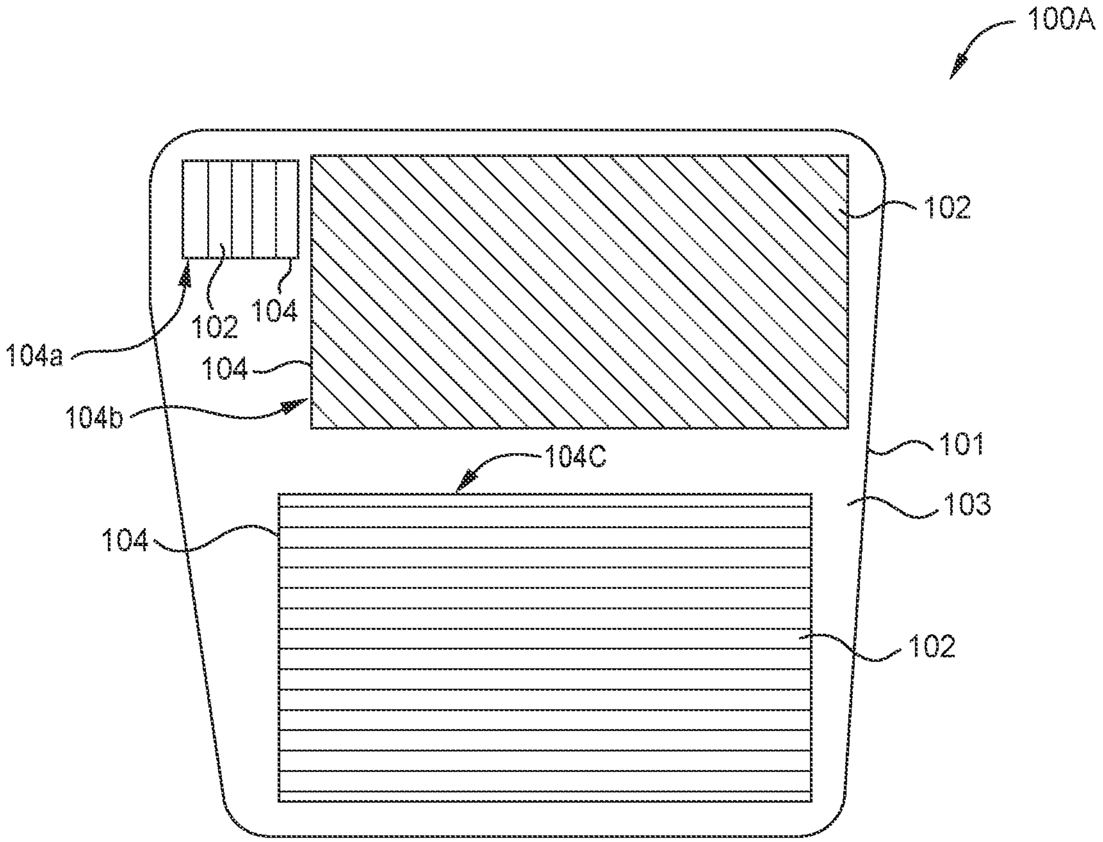
FIG. 1A is a schematic top view of an optical device, according to one or more embodiments.

FIG. 1A is a schematic top view of an optical device 100A, according to one or more embodiments.

Figure 1B:
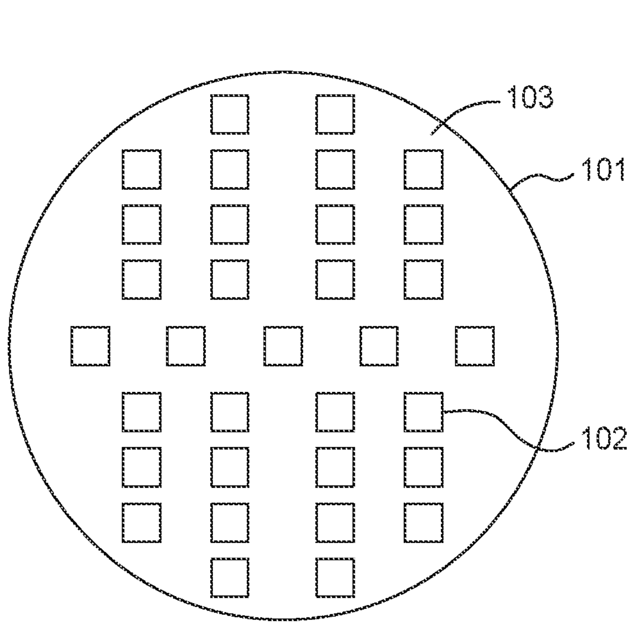
FIG. 1B is a schematic top view of an optical device, according to one or more embodiments.

FIG. 1B is a schematic top view of an optical device 100B, according to one or more embodiments. It is to be understood that the optical devices 100A and 100B described below are exemplary optical devices. In one or more embodiments described herein, the optical device 100A is a waveguide combiner, such as an augmented reality waveguide combiner for augmented reality (AR) and/or virtual reality (VR) applications. In or more embodiments described herein, the optical device 100B is a flat optical device, such as a metasurface.

The optical devices 100A and 100B include a plurality of optical device structures 102 disposed on a surface 103 of a substrate 101. The substrate 101 is an optical device substrate. The optical device structures 102 may be nanostructures having sub-micron dimensions, e.g., nano-sized dimensions. In or more embodiments, regions of the optical device structures 102 correspond to one or more gratings 104, such as a first grating 104*a*, a second grating 104*b*, and a third grating 104*c*. In or more embodiments, the optical device 100A is a waveguide combiner that includes at least the first grating 104*a* corresponding to an input coupling grating and the third grating 104*c* corresponding to an output coupling grating. In such an embodiment, the waveguide combiner includes the second grating 104*b* corresponding to an intermediate grating. While FIG. 1B depicts the optical device structures 102 as having square or rectangular shaped cross-sections, the cross-sections of the optical device structures 102 may have other shapes including, but not limited to, circular, triangular, elliptical, regular polygonal, irregular polygonal, and/or irregular shaped cross-sections. In or more embodiments, the cross-sections of the optical device structures 102 on a single optical device 100B are different.

The substrate 101 may be formed from any suitable material, provided that the substrate 101 can adequately transmit light in a desired wavelength or wavelength range and can serve as an adequate support for the optical device 100A and the optical device 100B, described herein. Substrate selection may include substrates of any suitable material, including, but not limited to, amorphous dielectrics, non-amorphous dielectrics, crystalline dielectrics, silicon oxide, polymers, and combinations thereof. In or more embodiments, the substrate 101 is transparent. In one or more embodiments, the substrate 101 includes silicon (Si), silicon dioxide ($SiO_2$), germanium (Ge), silicon germanium (SiGe), InP, GaAs, GaN, fused silica, quartz, sapphire, and/or high-index transparent materials such as high-refractive-index glass. In one or more embodiments, the substrate 101 is formed of glass and/or silicon carbide (SiC).

Figure 2:
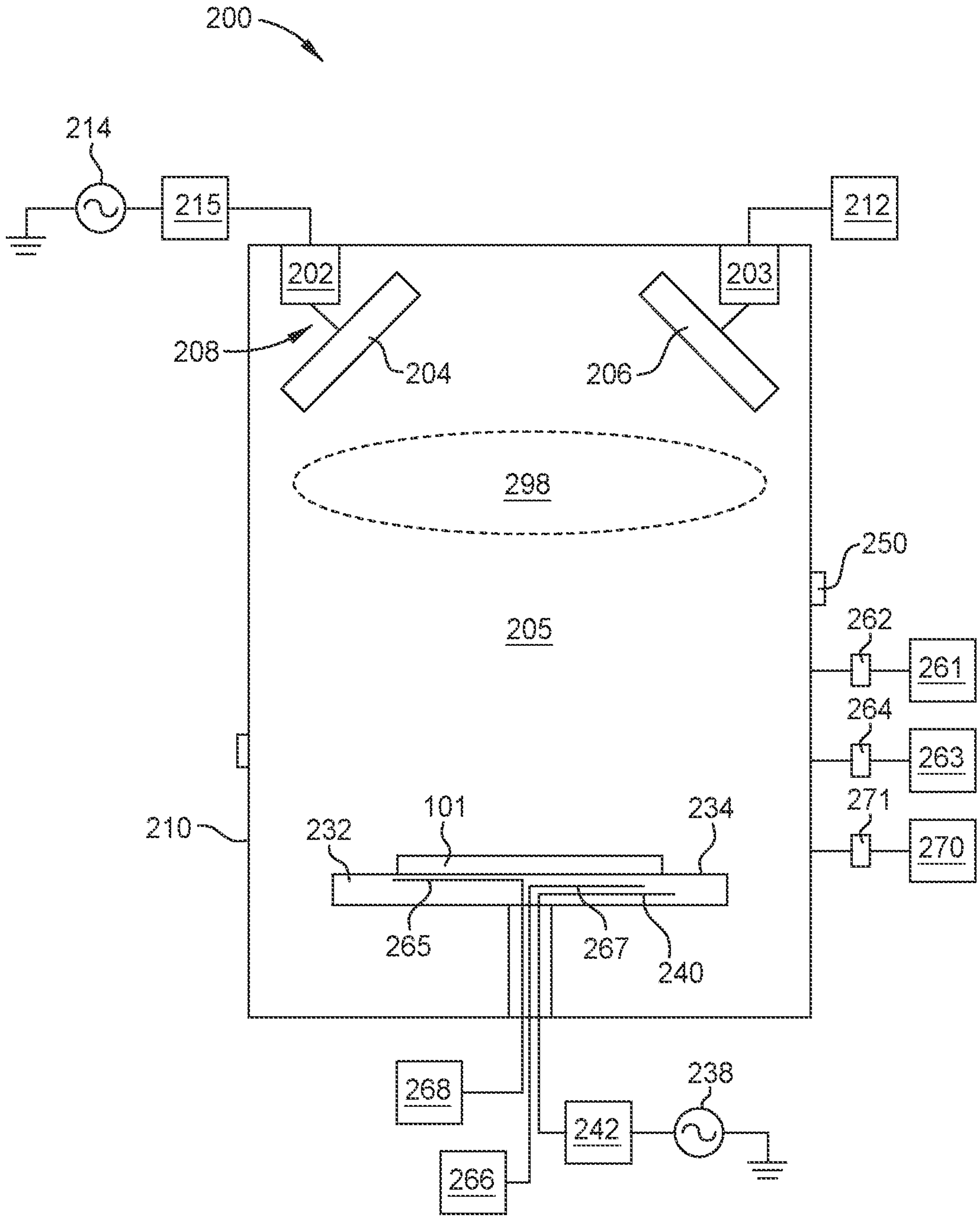
FIG. 2 is a schematic cross-sectional view of a physical vapor deposition (PVD) chamber, according to one or more embodiments.

FIG. 2 is a schematic cross-sectional view of a physical vapor deposition (PVD) chamber 200, according to one or more embodiments. The PVD chamber 200 may be used for the method 300 described below. It is to be understood that the PVD chamber 200 is an exemplary PVD chamber and other PVD chambers, including PVD chambers from other manufacturers, may be used with or modified to accomplish aspects of the present disclosure.

The PVD chamber 200 includes one or more cathodes 202, 203 that have a corresponding single target or a plurality of targets, attached to the chamber body 210 (e.g., via a chamber body adapter 208). In the implementation shown in FIG. 2, the PVD chamber 200 includes at least one first target 204 and at least one second target 206. The first target 204 includes at least one first material described herein and the second target 206 includes at least one second material described herein. Each cathode (e.g., the first target 204 and second target 206) may be coupled to a DC power source 212 and/or an RF power source 214 and a matching network 215.

The PVD chamber 200 is configured to include a substrate support 232 having a support surface 234 to support the substrate 101. The PVD chamber 200 includes an opening 250 (e.g., a slit valve) through which an end effector extends to place the substrate 101 onto lift pins for lowering the substrate 101 onto the support surface 234.

The PVD chamber 200 includes a sputter gas source 261 operable to supply a sputter gas, such as argon (Ar), krypton (Kr), and/or neon (Ne) to a process volume 205. The present disclosure contemplates that other sputter gas(es) may be used. A gas flow controller 262 is disposed between the sputter gas source 261 and the process volume 205 to control a flow of the sputter gas from the sputter gas source 261 to the process volume 205. The PVD chamber 200 includes a reactive gas source 263 operable to supply a reactive gas, such as an oxygen-containing gas or nitrogen-containing gas, to the process volume 205. A gas flow controller 264 is disposed between the reactive gas source 263 and the process volume 205 to control a flow of the reactive gas from the reactive gas source 263 to the process volume 205. The PVD chamber 200 may include a precursor gas source 270 operable to supply a precursor gas to the process volume 205. In one or more embodiments, a gas flow controller 271 is disposed between the precursor gas source 270 and the process volume 205 to control a flow of the precursor gas from the precursor gas source 270 to the process volume 205. Sputter gases, reactive gases, and precursor gases may each be referred to as process gases herein.

During processing, the process volume 205 can be maintained at a process pressure using a vacuum device and/or the gas flow controllers 262, 264, 271.

In the implementation shown in FIG. 2, the substrate support 232 includes an RF bias power source 238 coupled to a bias electrode 240 disposed in the substrate support 232 via a matching network 242. The substrate support 232 includes a mechanism that retains the substrate 101 on the support surface 234 of the substrate support 232, such as an electrostatic chuck, a vacuum chuck, a substrate retaining clamp, or the like. The substrate support 232 includes a cooling conduit 265 disposed in the substrate support 332 where the cooling conduit 265 controllably cools the substrate support 232 and the substrate 101 positioned thereon to a predetermined temperature, for example between about −20° C. to about 300° C. The cooling conduit 265 is coupled to a cooling fluid source 268 to provide cooling fluid. The substrate support 232 includes a heater 267 embedded therein. The heater 267, such as a resistive element, disposed in the substrate support 232 is coupled to an optional heater power source 266 and controllably heats the substrate support 232 and the optical device substrate 101 positioned thereon to a predetermined temperature, for example between about −150° C. to about 500° C.

While FIG. 2 depicts one first target 204 and one second target 206, the PVD chamber 200 may include two or more first targets 204 and/or two or more second targets 206. For example, 3-5 targets selected from at least one of the first targets 204 and/or the second targets 206 may be included in the PVD chamber 200. In one or more embodiments, each first target 204 is operable to deposit a different material. For example, 3-5 second targets 206 may be included in the PVD chamber 200. Each optical device material target 206 is operable to deposit a different material. In one or more embodiments with the one or more first targets 204 and the one or more second targets 206, each first target 204 is operable to deposit a different first material and/or each second target 206 is operable to deposit a different second material.

The PVD chamber 200 can be used to form one or more layers of optical device structures 102 of the substrate 101, for example as described below. In one or more embodiments, the PVD chamber 200 is used to form (e.g., deposit) the barrier layers of optical device structures.

During processing in such an embodiment, an argon (Ar) sputter gas and an oxygen (O) reactive gas are supplied to the process volume 205 while a pulsed direct current (DC) electrical power is supplied to the argon sputter gas and the oxygen reactive gas using the DC power source 212 to generate an oxygen-containing plasma 298 in the process volume 205. In one or more embodiments, the first target 204 includes silicon (Si). While the oxygen-containing plasma 298 is in the process volume 205, the oxygen gas reacts with the first target 204 to deposit a barrier layer on the substrate 101. Using the silicon-containing first target 204 and the oxygen reactive gas, the deposited barrier layer is formed of silicon dioxide ($SiO_2$). In one or more embodiments, the substrate 101 is maintained at a predetermined temperature between −150° C. and 500° C.

The present disclosure contemplates that the first target 204 or the second target 206 may be omitted. The present disclosure also contemplates that the first target 204 having the first material can be set to a first power level and the second target 206 having the second material can be set to a second power level that is lower or higher than the first power level.

The PVD chamber 200 can be used to form other layers of optical device structures on the substrate 101. For example, the PVD chamber 200 can be used to form the device function layers and/or the encapsulation layers of optical device structures. For example, an argon sputter gas, an oxygen reactive gas, and a titanium (Ti) first target 204 can be used to form device function layers that are formed of a titanium oxide (TiO).

Figure 3:
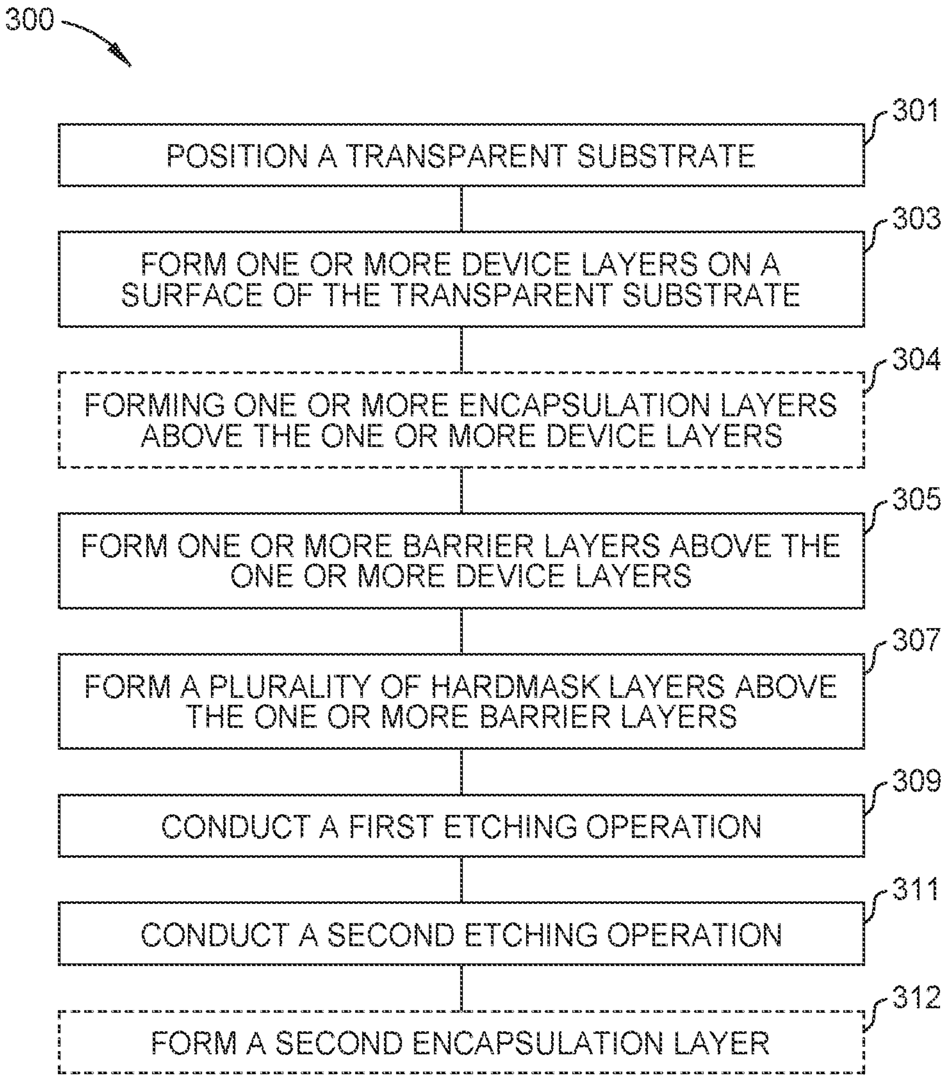
FIG. 3 is a schematic block diagram view of a method of forming a device, according to one or more embodiments.

FIG. 3 is a schematic block diagram view of a method 300 of forming a device, according to one or more embodiments.

Operation 301 includes positioning a transparent substrate. In one or more embodiments, the transparent substrate is positioned on a support surface of a substrate support.

Operation 303 includes forming one or more device function layers on a surface of the transparent substrate. Each of the one or more device function layers is formed of a metal oxide and has a first refractive index. In one or more embodiments, the first refractive index is 2.0 or greater, such as within a range of 2.3 to 2.5. In one or more embodiments, the one or more device function layers can be formed using nanoimprinting. In such an embodiment, a stamp having a stamp profile is used to press into a device function layer and form a plurality of device function layers that have a profile corresponding to the stamp profile. In one or more embodiments, the one or more device function layers can include a plurality of device function layers that are formed using an initial device etching operation and an initial hardmask etching operation, as described below in relation to FIGS. 5A-5D.

Optional operation 304 includes, prior to forming one or more barrier layers at operation 305, forming one or more encapsulation layers at least partially above the one or more device function layers. In such an embodiment, the one or more barrier layers of operation 305 are formed above the one or more encapsulation layers and the plurality of hardmask layers of operation 307 are formed above the one or more barrier layers.

Operation 305 includes forming one or more barrier layers above the one or more device function layers. Each of the one or more barrier layers has a second refractive index that is less than the first refractive index. In one or more embodiments, the second refractive index is less than 2.0. In one or more embodiments, the one or more barrier layers are formed above the one or more device function layers using a PVD operation.

The PVD operation can be conducted, for example, using the PVD chamber 200 described above. The PVD operation includes reacting one or more process gases with a target having silicon (Si). The one or more process gases includes one or more of argon (Ar) and/or oxygen (O). The argon gas can be a sputtering gas and the oxygen gas can be a reactive gas that reacts with the silicon target. The reacting of the one or more process gases with the target occurs while maintaining a process volume at a process pressure within a range of 1.0 mTorr to 50.0 mTorr. The method 300 further comprises generating a process plasma to facilitate reacting the one or more process gases with the target. The generating of the process plasma includes supplying a pulsed direct current (DC) electrical power to the one or more process gases. The described parameters of the method 300 facilitate depositing a barrier layer that facilitates reduced hardmask material diffusion, reduced hardmask material residue, and mitigated film loss for the optical device structures.

Operation 307 includes forming a plurality of hardmask layers above the one or more barrier layers. Each of the plurality of hardmask layers is formed of a hardmask material. In one or more embodiments, the hardmask material is a metal.

Operation 309 includes conducting a first etching operation that selectively etches the device relative to the plurality of hardmask layers.

Operation 311 includes conducting a second etching operation that selectively etches the plurality of hardmask layers to remove the plurality of hardmask layers. In one or more embodiments, the second etching operation includes wet etching to remove the plurality of hardmask layers.

Optional operation 312 includes forming a second encapsulation layer over the barrier layers.

The present disclosure contemplates that the formation of layers described in relation to operations 303, 304, 305, and/or 307 can be conducted using one or more of epitaxial deposition, multi-beam-epitaxy (MBE), ion-beam-assisted-deposition (IBAD), physical vapor deposition (PVD), chemical vapor deposition (CVD, such as plasma-enhanced CVD or flowable CVD), atomic layer deposition (ALD), nanoimprinting lithography, photolithography patterning, a liquid material pour casting process, a spin-on glass process, a spin-on coating process, a liquid spray coating process, a dry powder coating process, a screen printing process, and/or a doctor blading process.

The present disclosure contemplates that the etching described in relation to operations 303, 309, and/or 311 can be conducted using one or more of ion-beam etching, reactive ion etching, electron beam etching, dry etching, and/or wet etching.

Figure 4A:
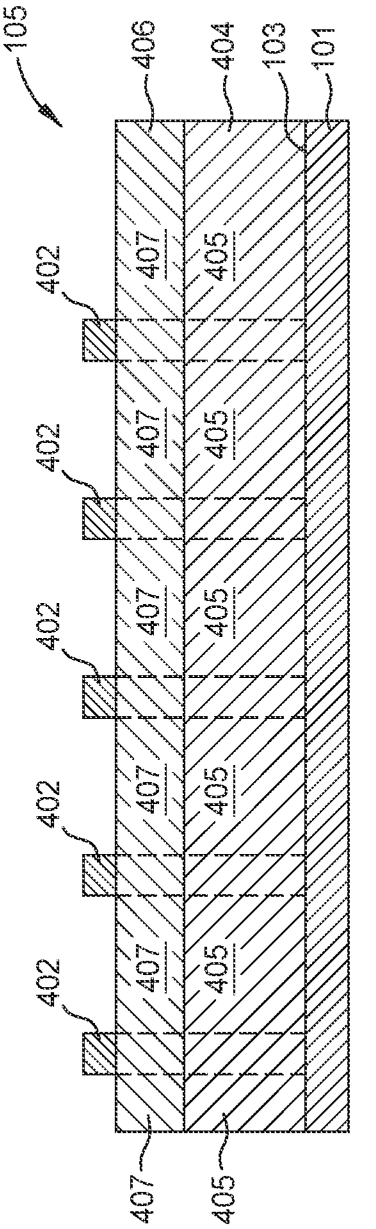
FIGS. 4A-4C are schematic, cross-sectional views of a portion of an optical device during the method of forming a device having a plurality of optical device structures, according to one or more embodiments.
Figure 4B:
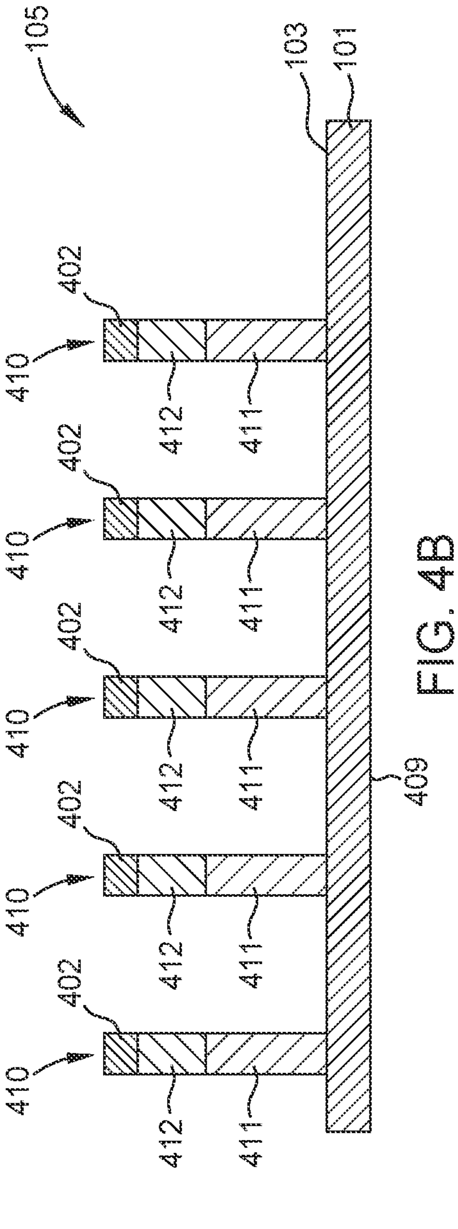
Figure 4C:
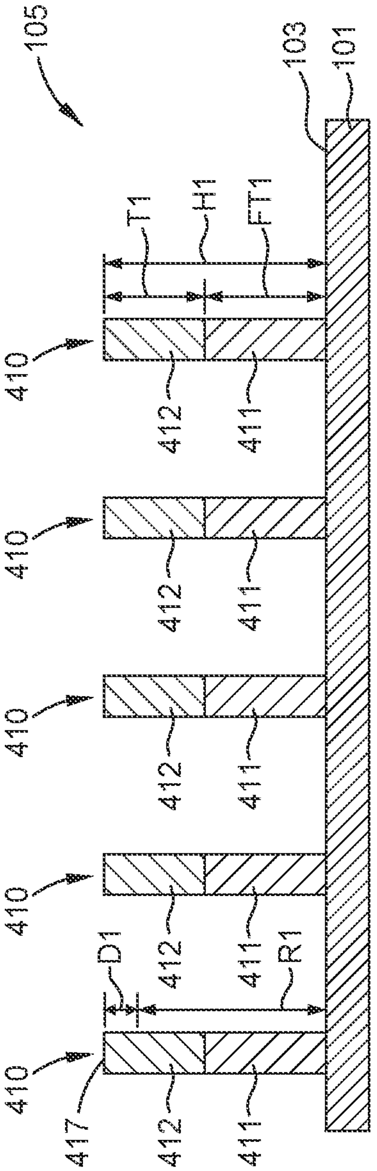

FIGS. 4A-4C are schematic, cross-sectional views of a portion 105 of an optical device 100A or 100B during the method 300 of forming a device having a plurality of optical device structures 410, according to one or more embodiments. In one or more embodiments, the portion 105 may correspond to a portion or a whole surface of the substrate 101 of a waveguide combiner, as shown in FIG. 1A. In one or more embodiments, the portion 105 may correspond to a portion or a whole surface of the substrate 101 of a flat optical device, as shown in FIG. 1B. The portion 105 may correspond to one or more gratings 104. In one or more embodiments, the portion 105 corresponds to the first grating 104*a*, the second grating 104*b*, and/or the third grating 104*c* of the optical device 100A and/or 100B.

As shown in FIG. 4A, a device function layer 404 is formed on a surface 103 of the transparent substrate 101 (as described in relation to operation 303). A barrier layer 406 is formed on the device function layer 404 (as described in relation to operation 305). A plurality of hardmask layers 402 are formed on the barrier layer 406 (as described in relation to operation 307). In one or more embodiments, the hardmask layers 402 are formed of a hardmask metal. The hardmask metal includes one or more of chromium (Cr), a chromium oxide (CrO), ruthenium (Ru), a titanium nitride (TiN), a tantalum nitride (TaN), and/or an aluminum nitride (AlN). In one or more embodiments, the hardmask layers 402 are formed of carbon (C), such as an amorphous carbon.

In one or more embodiments, the hardmask layers 402 are part of a patterned hardmask. The patterned hardmask is formed by disposing a hardmask layer over the barrier layer 406 and then patterning the hardmask layer to form the plurality of hardmask layers 402.

A first etching operation is conducted (as described in relation to operation 309). The first etching operation selectively etches the device function layer 404 and the barrier layer 406 relative to the plurality of hardmask layers 402 to remove device portions 405 of the device function layer 404 and barrier portions 407 of the barrier layer 406.

FIG. 4B shows the device portions 405 and the barrier portions 407 removed. A plurality of optical device structures 410 are formed. Each of the plurality of optical device structures 410 includes a respective device function layer 411 and a respective barrier layer 412.

A second etching operation is conducted (as described in relation to operation 311). The second etching operation selectively etches the plurality of hardmask layers 402 relative to the substrate to remove the plurality of hardmask layers 402 from the optical device structures 410.

FIG. 4C shows the plurality of hardmask layers 402 removed from the optical device structures 410. In the implementation shown in FIGS. 4A-4C, the device function layers 411 are formed of a metal oxide and have a first refractive index. The transparent substrate 101 is formed of glass. The metal oxide includes a titanium oxide (TiO) or a niobium oxide (NbO). The barrier layers 412 have a second refractive index that is less than the first refractive index. The barrier layers 412 are formed of a silicon oxide (SiO), a silicon nitride (SiN), a ruthenium oxide (RuO), and/or a tantalum oxide (TaO). In one or more embodiments, the barrier layers 412 are formed of silicon dioxide ($SiO_2$) to facilitate barrier layers 412 that facilitate reduced hardmask material diffusion, reduced hardmask material residue, and mitigated film loss for the optical device structures 410.

The device function layers 411 have a first density, and the barrier layers 412 have a second density that is greater than the first density. The barrier layers 412 have a thickness T1 that is at least 1 nm, such as 5 nm or higher, for example 10 nm or higher. In one or more embodiments, the thickness T1 is within a range of 1 nm to 50 nm, such as 5 nm to 50 nm, or 5 nm to 30 nm. In one or more embodiments, the thickness T1 is within a range of 1 nm to 30 nm. In one or more embodiments, the thickness T1 is within a range of 5 nm to 10 nm. In one or more embodiments, the thickness T1 is about 5 nm, about 10 nm, or about 30 nm. The device function layers 411 have a thickness FT1 that is within a range of 1 nm to 3000 nm. In one or more embodiments, the thickness FT1 is within a range of 50 nm to 300 nm. In one or more embodiments, the thickness FT1 is within a range of 50 nm to 100 nm, such as about 75 nm.

Using the atomic percentage concentration described herein, the optical loss of the optical device structures 410 (e.g., the optical loss of the device function layers 411, such as a loss of the thickness FT1) is less than 0.46%, such as less than 0.1%. In one or more embodiments, the optical loss is less than 0.05%, such as 0.02% or less.

An atomic percentage concentration of the hardmask material (which formed the hardmask layers 402 that are removed in FIG. 4C) is less than 0.7% throughout each of the one or more optical device structures 410 after the hardmask layers 402 are removed. The atomic percentage concentration of the hardmask material is less than 0.7% throughout the entirety of a height H1 of each of the one or more optical device structures 410. The atomic percentage concentration of the hardmask material that diffused into the barrier layers 412 or the device function layers 411 is less than 0.7% throughout the height H1. The atomic percentage concentration of the hardmask material that remains as residue on upper surfaces of the barrier layers 412 is less than 0.7%. In one or more embodiments, the atomic percentage concentration of the hardmask material is 0.3% or less throughout the height H1 of each of the one or more optical device structures 410. In one or more embodiments, the atomic percentage concentration of the hardmask material is 0.1% or less beginning at a depth D1 and throughout a remaining height R1 of each of the one or more optical device structures 410. The depth D1 is within a range of 0.1 nm to 108 nm, such as 3.0 nm.

The atomic percentage concentration includes a surface atomic percentage concentration (SAP) on an outer surface 417 of each of the one or more optical device structures 410. The SAP is less than 0.7%, such as 0.3% or less. The SAP is measured using a surface measurement, such as inductively coupled plasma mass spectrometry (ICP-MS). The present disclosure contemplates that other surface measurement techniques may be used to measure the SAP. The atomic percentage concentration includes a volumetric atomic percentage concentration (VAP) along the height H1 of each of the one or more optical device structures 410. The VAP is less than 0.7%, such as 0.3% or less. The VAP is measured using a volumetric measurement, such as depth profile X-ray photoelectron spectroscopy (XPS). The present disclosure contemplates that other volumetric measurement techniques, such as glow discharge mass spectroscopy (GDMS), may be used to measure the VAP. In one or more embodiments, the VAP along the height H1 of each of the one or more optical device structures 410 is less than 0.3%. In one or more embodiments, the VAP is 0.1% or less beginning at the depth D1 and throughout the remaining height R1 of each of the one or more optical device structures 410. In one or more embodiments, the depth D1 is relative to the outer surface 417. In one or more embodiments, the outer surface 417 is an upper surface of the barrier layer 412.

The substrate 101 can include other layers, such as an anti-reflection layer on a backside surface 409 of the substrate 101. The optical device structures 410 can be used as optical grating couplers of optical devices, such as input couplers and/or output couplers of optical devices (for example, waveguide combiners).

FIGS. 5A-5D are schematic, cross-sectional views of a portion 505 of an optical device 100A or 100B during the method 300 of forming a device having a plurality of optical device structures 510, according to one or more embodiments.

Figure 5A:
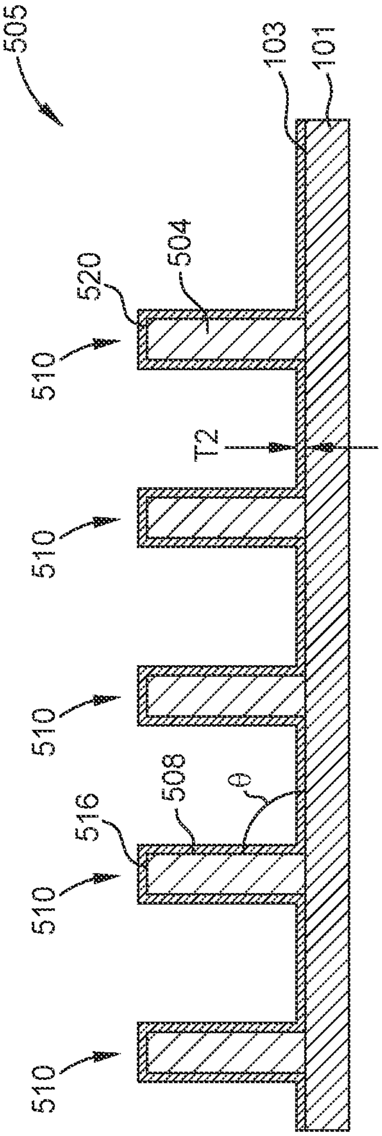
FIGS. 5A-5D are schematic, cross-sectional views of a portion of an optical device or during the method of forming a device having a plurality of optical device structures, according to one or more embodiments.

As shown in FIG. 5A, a plurality of device function layers 504 are formed on a surface 103 of the transparent substrate 101 (as described in relation to operation 303). The device function layers 504 can be formed, for example, using nanoimprinting. In such an embodiment, a stamp having a stamp profile is used to press into an initial device function layer and form the plurality of device function layers 504 that have a profile corresponding to the stamp profile. Portions of the initial device function layer between the device function layers 504 shown can be etched following the stamping. In one or more embodiments, the plurality of device function layers 504 are formed using an initial device etching operation and an initial hardmask etching operation that occur before operation 304 of the method 300. In such an embodiment, the initial device function layer (which can be similar to the device function layer 404 of FIGS. 4A and 4B) can be etched using the initial device etching operation in a manner similar to that described for the first etching operation in relation to FIGS. 4A and 4B. The initial hard mask layers (which can be similar to the hardmask layers 402 of FIGS. 4A and 4B) can then be removed using the initial hardmask etching operation in a manner similar to that described for the second etching operation in relation to FIGS. 4B and 4C.

Following the formation of the plurality of device function layers 504, an encapsulation layer 520 is formed over the device function layers 504, as shown in FIG. 5A (and as described in relation to optional operation 304). The encapsulation layer 520 is formed of silicon dioxide ($SiO_2$). In one or more embodiments, the encapsulation layer 520 is deposited such that the encapsulation layer 520 is disposed over at least a top surface 516 and one sidewall 508 of each optical device structure 510 of the plurality of optical device structures 510. In one or more embodiments, the encapsulation layer 520 is disposed over the top surface 516 and both sidewalls 508 of each optical device structure 510 of the plurality of optical device structures 510 and over the surface 103 of the substrate 101.

The plurality of optical device structures 510 are formed at a device angle θ. The device angle θ is the angle between the surface 103 of the substrate 101 and the sidewall 508 of the optical device structure 510. As shown in FIGS. 5A-5D, the plurality of optical device structures 510 are vertical, e.g., the device angle θ is about 90 degrees, such as within a range of 87 degrees to 93 degrees. The plurality of optical device structures 510 can be angled relative to the surface 103 of the substrate 101. In one or more embodiments, each respective device angle θ for each optical device structure 510 is substantially equal. In one or more embodiments, at least one respective device angle θ of the plurality of optical device structures 510 is different than another device angle θ of the plurality of optical device structures 510.

Figure 5B:
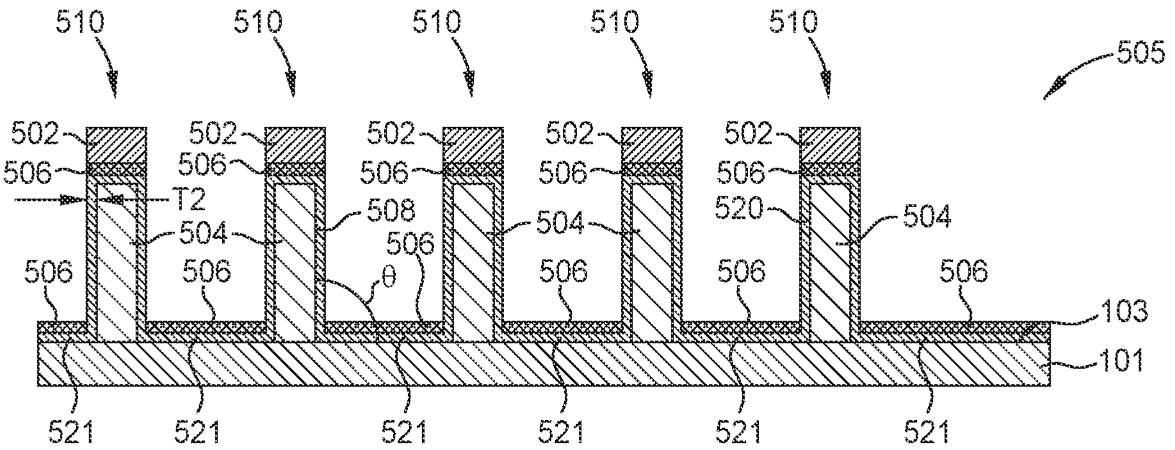
Figure 5C:
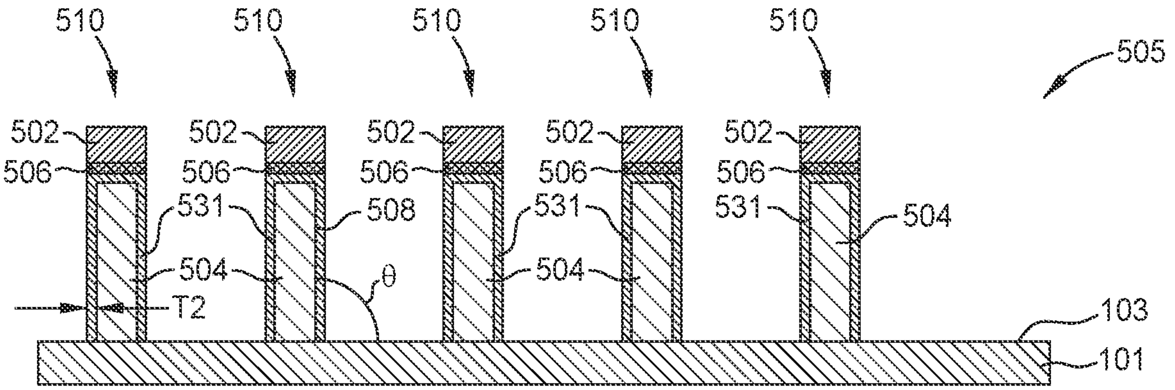

After the encapsulation layer 520 is formed, a plurality of barrier layers 506 (similar to the barrier layer 406 shown in FIG. 4A), are formed above the encapsulation layer 520—as shown in FIG. 5B. A plurality of hardmask layers 502 are then formed above some of the barrier layers 506 (as described in relation to operation 307)—as shown in FIG. 5C. The first etching operation (as described in relation to operation 309) selectively etches the encapsulation layer 520 and some of the barrier layers 506 relative to the plurality of hardmask layers 502 to remove encapsulation portions 521 of the encapsulation layer 520 and some of the barrier layers 506—as shown in FIG. 5C. The removal of the encapsulation portions 521 forms a plurality of encapsulation layers 531. The encapsulation layers have a thickness T2 that is within a range of 10 nm to 200 nm.

Figure 5D:
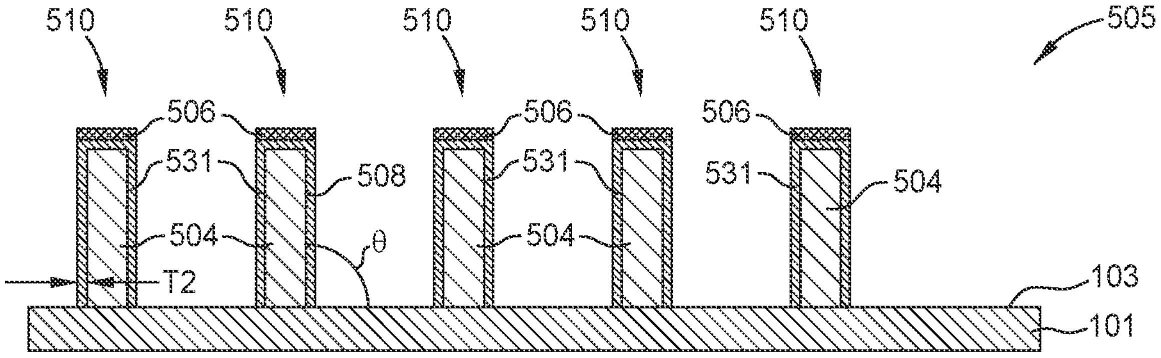

The second etching operation (as described in relation to operation 311) selectively etches the plurality of hardmask layers 502 relative to the transparent substrate 101 to remove the plurality of hardmask layers 502—as shown in FIG. 5D. The encapsulation layers 531 are formed of silicon dioxide ($SiO_2$). The encapsulation layers 531 are disposed at least partially between the device function layers 504 and the barrier layers 506. In one or more embodiments, the barrier layers 506 are formed of the same material as the encapsulation layer 520. Using the same material for the barrier layers 506 and separately forming the barrier layers 506 (after forming the encapsulation layer 521) facilitates reduced film loss (such as of the device function layers 504) while facilitating reduced hardmask residue and reduced hardmask diffusion.

Figure 5E:
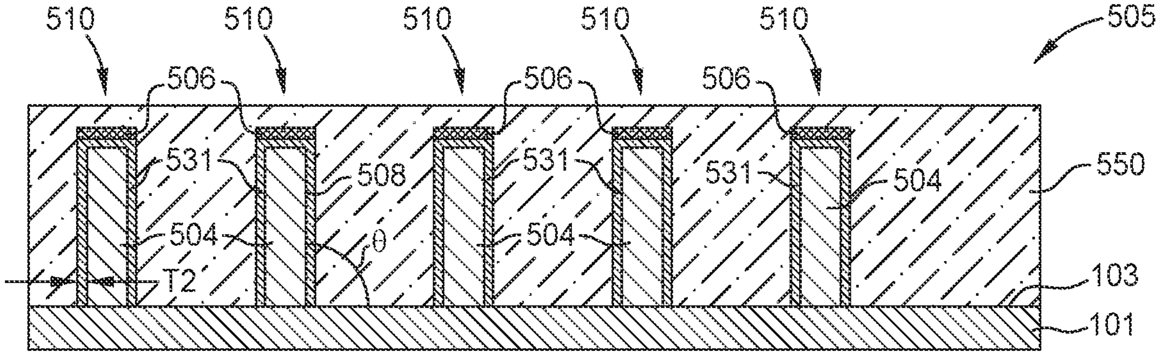
FIG. 5E is a schematic, cross-sectional view of the portion of the optical device after an optional operation of the method, according to one or more embodiments.

FIG. 5E is a schematic, cross-sectional view of the portion 505 of the optical device 100A or 100B after an optional operation of the method 300, according to one or more embodiments. A second encapsulation layer 550 is formed (as described in relation to optional operation 312) over the barrier layers 506 and the transparent substrate 101. The second encapsulation layer 550 is formed of silicon dioxide ($SiO_2$). The second encapsulation layer 550 fills spaces between and outwardly of the encapsulation layers 531. The second encapsulation layer 550 is also formed over the barrier layers 506. The present disclosure contemplates that the encapsulation layers 531 could be omitted from the implementation shown in FIG. 5E (as shown in FIG. 4C, for example) such that the encapsulation layer 550 is disposed over the barrier layers 506 and filling the openings between and outwardly of the barrier layers 506 and the device function layers 504.

Figure 6:
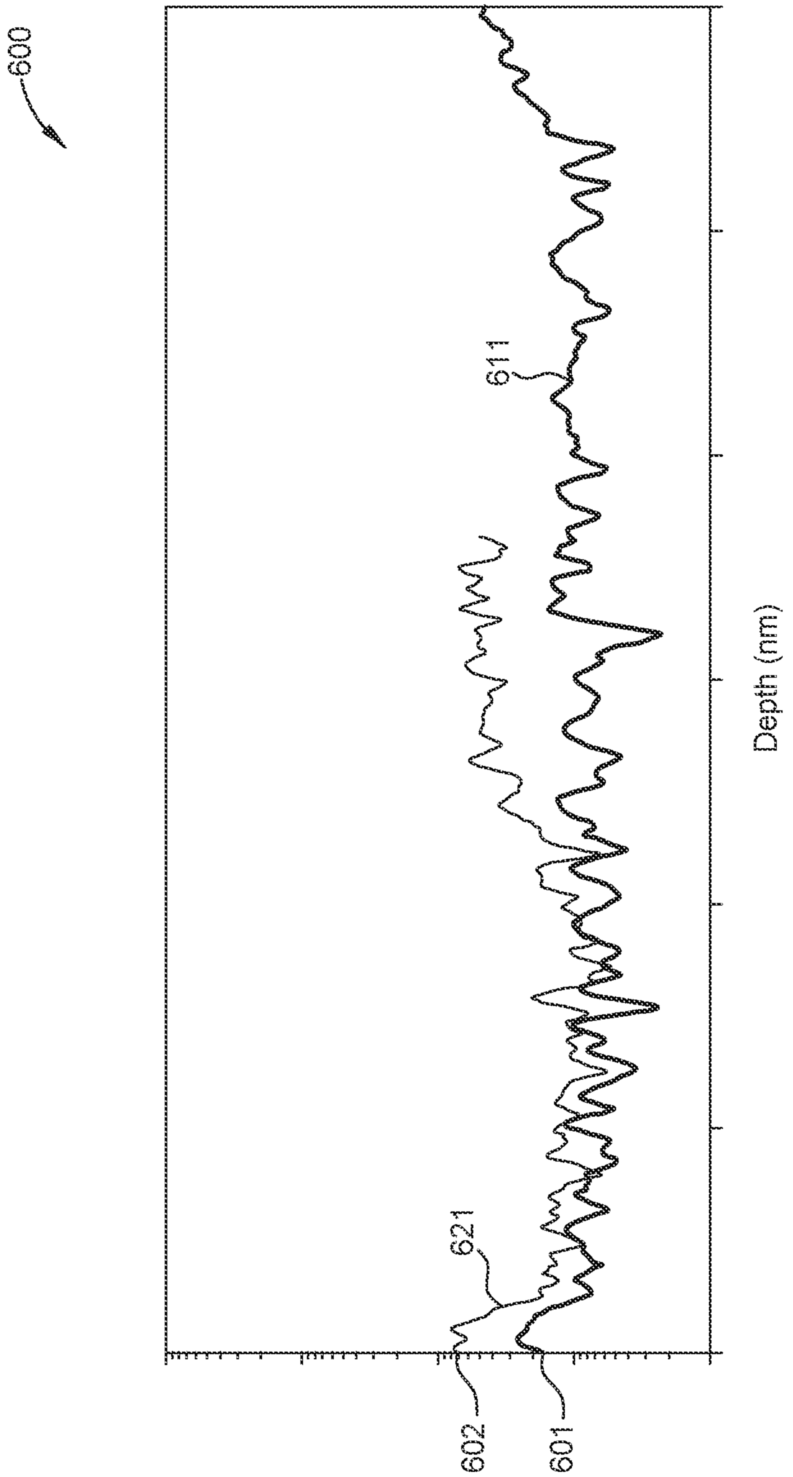
FIG. 6 is a schematic graphical view of a graph showing hardmask residue, hardmask diffusion, and device function layer film retention versus depth, according to one or more embodiments.

FIG. 6 is a schematic graphical view of a graph 600 showing hardmask residue and hardmask diffusion versus depth, according to one or more embodiments.

The horizontal axis plots the depth (in nm) of measurements taken throughout the height H1 of an optical device structure, starting at a top surface of the optical device structure and extending downward.

A first profile 611 plots on the vertical axis the amount of hardmask residue (at a depth of 0 nm) and the amount of hardmask diffusion throughout the depth. The first profile 611 measured an optical device structure that used a barrier layer (according to one or more embodiments described herein) between the hardmask layer and the device function layer.

A second profile 621 plots on the vertical axis the amount of hardmask residue (at a depth of 0 nm) and the amount of hardmask diffusion throughout the depth. The second profile 621 measured an optical device structure that did not use a barrier layer between the hardmask layer and the device function layer.

For each profile 611, 621 chromium (Cr) was used as the hardmask material.

By comparing the first profile 611 with the second profile 621, it can be seen that using a barrier layer described herein reduces the hardmask diffusion of the hardmask material throughout the height H1 of optical device structures. Additionally, by comparing a first data point 601 of the first profile 611 with a second data point 602 of the second profile 621, it can be seen that using a barrier layer described herein reduces the hardmask residue on upper surfaces of optical device structures. The first data point 601 exhibits a hardmask material residue amount that is 70% less than the hardmask material residue amount of the second data point 602.

Furthermore, any film loss is mitigated using a barrier layer. Using aspects described herein, it has been found that the barrier layers described herein can reduce film loss of the device function layers by a factor of 3.75 or greater (such as a factor of 5.2) compared to other configurations that do not use the barrier layers.

Using subject matter described herein, it has been found that the barrier layers described reduce the atomic percentage concentration of residual hardmask material (following removal of hardmask layers) on the upper surfaces of the barrier layers. The atomic percentage concentration is reduced down to 0.3% or less. Such an atomic percentage concentration is lesser than configurations that do not use the barrier layers, where the atomic percentage concentration of residual hardmask material (following removal of hardmask layers) on the upper surfaces of the device function layers or the encapsulation layers can be 1.0% or more.

Benefits of the present disclosure include reduced diffusion of hardmask materials into other layers of optical device structures; reduced residual of hardmask materials following removal of hardmask layers; relatively maintained film thickness (e.g., less film thickness loss compared to other operations) of optical device structures; less optical loss; and enhanced optical device performance, such as for AR applications and/or VR applications.

Moreover, the aspects of the present disclosure achieve relatively low hardmask diffusion and hardmask residue, and relatively low film loss, in a manner that is cost-effective, simple, modular, and efficient. For example, otherwise changing the hardmask material can increase costs and complexity, and can reduce modularity of applications and equipment.

It is contemplated that one or more aspects disclosed herein may be combined. As an example, one or more aspects, features, components, and/or properties of the optical device 100A, the optical device 100B, the PVD chamber 200, the method 300, the optical device structures 410, the optical device structures 510, the operations described in relation to FIGS. 4A-4C, and/or the operations described in relation to FIGS. 5A-5D may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A device, comprising:

a substrate;

at least an incoupler grating and an outcoupler grating, the outcoupler grating comprising a plurality of optical device structures disposed on a surface of the substrate, each of the plurality of optical device structures comprising:

a device function layer formed of a metal oxide, the device function layer having a first refractive index, and a barrier layer disposed only above the device function layer, the barrier layer having a second refractive index that is less than the first refractive index; and one or more openings between the plurality of optical device structures, wherein the device includes a hardmask material having an atomic percentage concentration that is less than 0.7% throughout each of the plurality of optical device structures, the atomic percentage concentration comprising:

a surface atomic percentage concentration (SAP) on an outer surface of each of the plurality of optical device structures, wherein the surface atomic percentage is less than 0.7%, and a volumetric atomic percentage concentration (VAP) along a height of each of the plurality of optical device structures, wherein the VAP is less than 0.7%.

2. The device of claim 1, wherein the plurality of optical device structures are formed at least by wet etching a hardmask layer disposed on the barrier layer, and the hardmask layer is formed of the hardmask material.

3. The device of claim 2, wherein the atomic percentage concentration of the hardmask material is 0.3% or less throughout each of the plurality of optical device structures.

4. The device of claim 1, wherein the metal oxide includes a titanium oxide (TiO) or a niobium oxide (NbO).

5. The device of claim 4, wherein the barrier layer is formed of a silicon oxide (SiO), a silicon nitride (SiN), a ruthenium oxide (RuO), or a tantalum oxide (TaO).

6. The device of claim 4, wherein the barrier layer is formed of silicon dioxide ($SiO_2$).

7. The device of claim 4, wherein the hardmask material includes one or more of chromium (Cr), a chromium oxide (CrO), ruthenium (Ru), carbon (C), a titanium nitride (TiN), a tantalum nitride (TaN), or an aluminum nitride (AlN).

8. The device of claim 1, wherein each of the plurality of optical device structures further comprises:

an encapsulation layer disposed over a top surface and both sidewalls of the device function layer, and the encapsulation layer at least partially between the device function layer and the barrier layer.

9. The device of claim 8, wherein the encapsulation layer is formed of silicon dioxide ($SiO_2$).

10. The device of claim 1, wherein the device function layer has a first density, and the barrier layer has a second density that is greater than the first density.

11. The device of claim 1, wherein the barrier layer has a thickness within a range of 5 nm to 50 nm.

12. The device of claim 1, further comprising a layer disposed in the one or more openings between the optical device structures, wherein the layer includes a different material than the device function layer and the barrier layer of the optical device structures.

13. A device, comprising:
- a substrate;
- at least an incoupler grating and an outcoupler grating, the outcoupler grating comprising a plurality of optical device structures disposed on a surface of the transparent substrate, each of the plurality of optical device structures comprising:
  - a device function layer formed of a metal oxide, the device function layer having a first refractive index, and
  - a barrier layer disposed only above the device function layer, the barrier layer having a second refractive index that is less than the first refractive index; and
- one or more openings between the plurality of optical device structures;
- a layer disposed in the one or more openings between the optical device structures, the layer including a different material than the device function layer of the optical device structures,
- wherein the device includes a hardmask material having:
  - a surface atomic percentage concentration (SAP) on an outer surface of each of the plurality of optical device structures, wherein the SAP is less than 0.7%, and
  - a volumetric atomic percentage concentration (VAP) along a height of each of the plurality of optical device structures is less than 0.3%, wherein the VAP is 0.1% or less beginning at a depth and throughout a remaining height of each of the plurality of optical device structures, and the depth is within a range of 0.1 nm to 108 nm.

14. A device, comprising:
- a substrate;
- at least an incoupler grating and an outcoupler grating, the outcoupler grating comprising a plurality of optical device structures disposed on a surface of the transparent substrate, each of the plurality of optical device structures comprising:
  - a device function layer having a first refractive index,
  - a barrier layer disposed only above the device function layer, the barrier layer having a second refractive index that is less than the first refractive index, and
  - an encapsulation layer disposed over a top surface and both sidewalls of the device function layer, the encapsulation layer formed of silicon dioxide ($SiO_2$); and
- one or more openings between the respective encapsulation layers of the plurality of optical device structures;
- a layer disposed in the one or more openings between the encapsulation layers of the optical device structures, the layer including a different material than the device function layer of the optical device structures,
- wherein the device includes a hardmask material having an atomic percentage concentration that is less than 0.7% throughout each of the plurality of optical device structures, the atomic percentage concentration comprising:
  - a surface atomic percentage concentration (SAP) on an outer surface of each of the plurality of optical device structures, wherein the surface atomic percentage is less than 0.7%, and
  - a volumetric atomic percentage concentration (VAP) along a height of each of the plurality of optical device structures, wherein the VAP is less than 0.7%.

15. The device of claim 14, wherein the barrier layer is formed of $SiO_2$.

16. The device of claim 15, wherein the encapsulation layer has a thickness within a range of 10 nm to 200 nm.

17. The device of claim 14, wherein the layer fills the one or more openings.

18. The device of claim 14, wherein the barrier layer has a thickness within a range of 5 nm to 50 nm.

19. The device of claim 14, wherein the hardmask material includes one or more of chromium (Cr), a chromium oxide (CrO), ruthenium (Ru), carbon (C), a titanium nitride (TiN), a tantalum nitride (TaN), or an aluminum nitride (AlN).

20. The device of claim 14, wherein the device function layer includes a titanium oxide (TiO) or a niobium oxide (NbO).

* * * * *